(12) United States Patent (10) Patent No.: US 7,515,887 B2
Saitoh (45) Date of Patent: Apr. 7, 2009

(54) RADIO-CONTROLLED TIMEPIECE

(75) Inventor: Yoritaka Saitoh, Chiba (JP)

(73) Assignee: Seiko Instruments Inc. (JP)

( * ) Notice: Subject to any disclaimer, the term of this patent is extended or adjusted under 35 U.S.C. 154(b) by 472 days.

(21) Appl. No.: 11/286,380

(22) Filed: Nov. 23, 2005

(65) Prior Publication Data

US 2006/0111064 A1 May 25, 2006

(30) Foreign Application Priority Data

Nov. 25, 2004 (JP) ............................. 2004-340357
Oct. 28, 2005 (JP) ............................. 2005-314051

(51) Int. Cl.
*H04B 1/18* (2006.01)
*H04Q 7/20* (2006.01)

(52) U.S. Cl. ................. 455/191.1; 455/197.2; 455/255; 368/47

(58) Field of Classification Search ... 455/191.1–191.2, 455/197.2, 255, 265; 368/47, 55
See application file for complete search history.

(56) References Cited

FOREIGN PATENT DOCUMENTS

| CN | 1197339 | 10/1998 |
|----|---------|---------|
| CN | 1445628 | 10/2003 |
| DE | 42 27 502 | 3/1994 |
| EP | 1189347 | 3/2002 |
| EP | 1465027 | 10/2004 |
| JP | 02082187 | 3/2002 |
| WO | 03038999 | 5/2003 |
| WO | 2004043050 | 5/2004 |
| WO | 2004083967 | 9/2004 |
| WO | WO-2004/083967 | 9/2004 |

*Primary Examiner*—Lee Nguyen
(74) *Attorney, Agent, or Firm*—Adams & Wilks

(57) ABSTRACT

In a radio-controlled timepiece, a tuning unit outputs a signal corresponding to a radio signal. An amplifier unit amplifies a signal output from the tuning unit. A receiving unit that extracts the time code from the amplified signal has a filter unit that selectively allows one of frequency signals to pass therethrough. A time-correcting unit acquires current time information from the extracted time code to correct a current time clocked by a clock unit. A control unit detects a voltage level of a signal output from the amplifier unit at two or more points while changing a capacitance value of a variable-capacitance unit of the tuning unit, uses, as a tuning point, a point meeting a given requirement among the points where the voltage level has been detected, and sets the capacitance value of the variable-capacitance unit at the tuning point as a capacitance value to receive the time code when it is judged that a time code has been output from the receiving unit at the tuning point. When it is judged that no time code is output from the receiving unit at the tuning point, the control unit controls the filter unit so as to change the frequency that the filter unit allows a signal to pass therethrough.

20 Claims, 8 Drawing Sheets

FIG. 3A STANDARD RADIO SIGNAL

FIG. 3B TIME CODE OUTPUT

FIG. 3C AGC OUTPUT

RADIO-CONTROLLED TIMEPIECE

BACKGROUND OF THE INVENTION

1. Field of the Invention

The present invention relates to a radio-controlled timepiece that corrects time based on time information that the timepiece received in radio waves.

2. Description of the Prior Art

A radio-controlled timepiece that receives radio signals indicating a precise time and automatically corrects time has been developed previously.

Currently, in various countries (e.g. Germany, Japan, America, and England) a radio station placed at a given location sends out a standard low frequency radio wave with time information superposed thereon. In Japan, two transmitter stations send out 40-kHz and 60-kHz standard low frequency radio waves modulated in amplitude by a time code of a format as in FIG. 5.

A radio-controlled timepiece, which receives the standard low frequency radio waves and corrects time data of a clock circuit, has been commercialized. In the case of a radio-controlled timepiece like this, it is equipped with an antenna and a tuning circuit for receiving a standard radio wave.

FIG. 4 is a block diagram of a conventional radio-controlled timepiece including a timing circuit. In FIG. 4, 401 represents an antenna which catches a radio signal to generate a received signal. 402 represents a tuning circuit in which capacitors are connected in parallel. And, the antenna circuit is tuned with the inductance value of the antenna 401 and the capacitance value of the tuning circuit 402 to e.g. a receiving frequency of 40 kHz. Signals from the antenna circuit tuned to 40 kHz are input to the receiving unit 403, and a time code including current time information is output.

The time format-recognizing unit incorporated in the control unit 404 picks out current time information from the time code, and the current time of the clock unit provided in the control unit 404 for clocking is corrected according to the precise current time information. The display unit 405 displays the time that the clock unit keeps (precise time after the correction in this case).

The control unit 404 performs ON/OFF control of the operation to receive a standard radio signal by performing ON/OFF control of the receiving unit 403.

Further, in recent years, as for example in a radio-controlled timepiece capable of receiving standard low frequency radio waves in Japan and Germany, a method including connecting two or more capacitors and switching them for tuning to the respective frequencies, JJY of Japan, 40 kHz and 60 kHz, and DCF of Germany, 77.5 kHz, has been adopted (see JP-A-2002-82187).

For adjustment of the receiving sensitivity of the tuning circuit in the above configuration, a method including preparing a few kinds of capacitors as the ones used in the tuning circuit and determining the capacitance of the capacitor so as to match each inductance of the bar antenna has been adopted.

In the method to adjust the receiving sensitivity, the way to exchange the capacitance of the capacitor has the following problem. That is, the adjustment performed by a combination of two or more capacitors makes the work to assemble the radio-controlled timepiece complicated and requires a long time and as such, the rate of work is unfavorable.

In addition, the bar antenna is relatively compact and has a high Q value and as such, only a slight change of factor, such as change of temperature or the presence of a metal near the antenna, can change the tuning frequency largely. Therefore, the method to adjust the receiving sensitivity has the following problem. That is, even when the adjustment is made to bring the tuning circuit into a tuning condition once, there is a high probability that tuning circuit falls into an untuned condition after having passed into the hands of a user, which deteriorates the receiving sensitivity.

The invention is made to solve the foregoing problems, and its subject is to facilitate tuning to a standard radio signal.

Also, a subject of the invention is to enable tuning to two or more standard radio signals different in frequency.

In addition, a subject of the invention is to allow the assembling work to be performed readily.

SUMMARY OF THE INVENTION

The invention provides a radio-controlled timepiece having an antenna to receive a radio signal including a time code having current time information, a tuning unit having a variable-capacitance unit, which outputs a signal corresponding to the radio signal received by the antenna, and an amplifier unit that amplifies a signal output from the tuning unit, including: a receiving unit that extracts the time code from a signal amplified by the amplifier unit; a time-correcting unit that acquires current time information from the time code extracted by the receiving unit to correct a current time clocked by a clock unit; a display unit that displays the current time clocked by the clock unit; and a control unit that detects a voltage level of a signal output from the amplifier unit at points while changing a capacitance value of the variable-capacitance unit, makes, of the points where the voltage level has been detected, a point meeting a given requirement a tuning point, and sets the capacitance value of the variable-capacitance unit at the tuning point as a capacitance value to receive the time code when it is judged that a time code has been output from the receiving unit at the tuning point.

The tuning unit having the variable-capacitance unit outputs a signal corresponding to a radio signal received by the antenna. The receiving unit amplifies the signal output from the tuning unit with the amplifier unit and extracts the time code from the signal amplified by the amplifier unit. The time-correcting unit acquires current time information from the time code extracted by the receiving unit, and corrects the current time that the clock unit clocks. The display unit displays the current time that the clock unit clocks. The control unit detects the voltage level of a signal output from the amplifier unit at points while changing the capacitance value of the variable-capacitance unit, makes, of the points where the voltage level is detected, a point meeting the given requirement a tuning point, and sets the capacitance value of the variable-capacitance unit at the tuning point as a capacitance value to receive the time code when it is judged that the time code has been output from the receiving unit at the tuning point.

Here, the variable-capacitance unit may include a variable-capacitance diode, and the amplifier unit may be an AGC amplifier unit.

The receiving unit may have a filter unit that selectively allows one of frequency signals to pass therethrough, and a detection unit that extracts the time code from a signal having passed through the filter unit to output the time code, and the control unit may control the filter unit so as to change the frequency that the filter unit allows to pass therethrough when it is judged that no time code is output from the receiving unit at the tuning point.

In addition, the variable-capacitance unit may include a rough adjustment part having roughly-adjusting capacitors different in capacitance value from each other, and a fine adjustment part having finely-adjusting capacitors smaller in capacitance value than the roughly-adjusting capacitors, and the control unit may combine the roughly-adjusting capacitors and finely-adjusting capacitors, thereby to change the capacitance value of the variable-capacitance unit.

The roughly-adjusting capacitors may be selected so as to provide a capacitance value corresponding to a receiving frequency, and the control unit may use the finely-adjusting capacitor to finely adjust a deviation of a tuning frequency from the receiving frequency when the roughly-adjusting capacitor is used.

The fine adjustment part may include finely-adjusting capacitors, and the control unit may select a combination of the capacitors included in the rough adjustment part and fine adjustment part thereby to change the capacitance value of the variable-capacitance unit.

The finely-adjusting capacitors included in the fine adjustment part may be constituted by variable-capacitance diodes, and the control unit may select the capacitors of the rough adjustment part and changes a capacitance value of the variable-capacitance diode, thereby to change the capacitance value of the variable-capacitance unit.

The amplifier unit may be an AGC amplifier unit.

The control unit may make, of the points where the voltage level has been detected, a point where the voltage level is the lowest the tuning point.

The control unit may make, of the points where the voltage level is detected, a point where the voltage level falls within a given range decided previously a tuning point.

The receiving unit may have an A/D converter that converts the voltage level of a signal output from the amplifier unit into a digital signal, and the control unit may determine the tuning point based on the digital signal output from the A/D converter.

The radio-controlled timepiece may have a storing unit to store a capacitance value of the variable-capacitance diode when reception of the time code has succeeded, wherein the control unit may set the capacitance value of the variable-capacitance unit last time when reception of the time code was received as a capacitance value of the variable-capacitance unit and terminate a time-correcting process in a case where it is judged that no time code is received even when the frequency that the filter unit allows to pass therethrough is changed.

When the time code is received to perform the time-correcting process, the control unit may store the capacitance value of the variable-capacitance unit at that time in the storing unit, and exercise control so that the capacitance value stored in the storing unit is made an initial value of the variable-capacitance unit in a subsequent time-correcting process.

The control unit may judge that the time code has been received when an edge of a received digital signal has been detected successively a given number of times.

The radio-controlled timepiece may have a manipulation unit to provide an instruction for a tuning operation, wherein the control unit may change the capacitance value of the variable-capacitance unit so as to tune in to the radio signal in response to the instruction for the tuning operation by the manipulation unit.

The control unit may further change the capacitance value of the variable-capacitance unit so as to tune in to the radio signal at a previously decided time or a time of reset.

BRIEF DESCRIPTION OF THE DRAWINGS

A preferred form of the present invention is illustrated in the accompanying drawings in which.

DETAILED DESCRIPTION OF THE PREFERRED EMBODIMENTS

A radio-controlled timepiece according to an embodiment of the invention will be described below.

Figure 1:
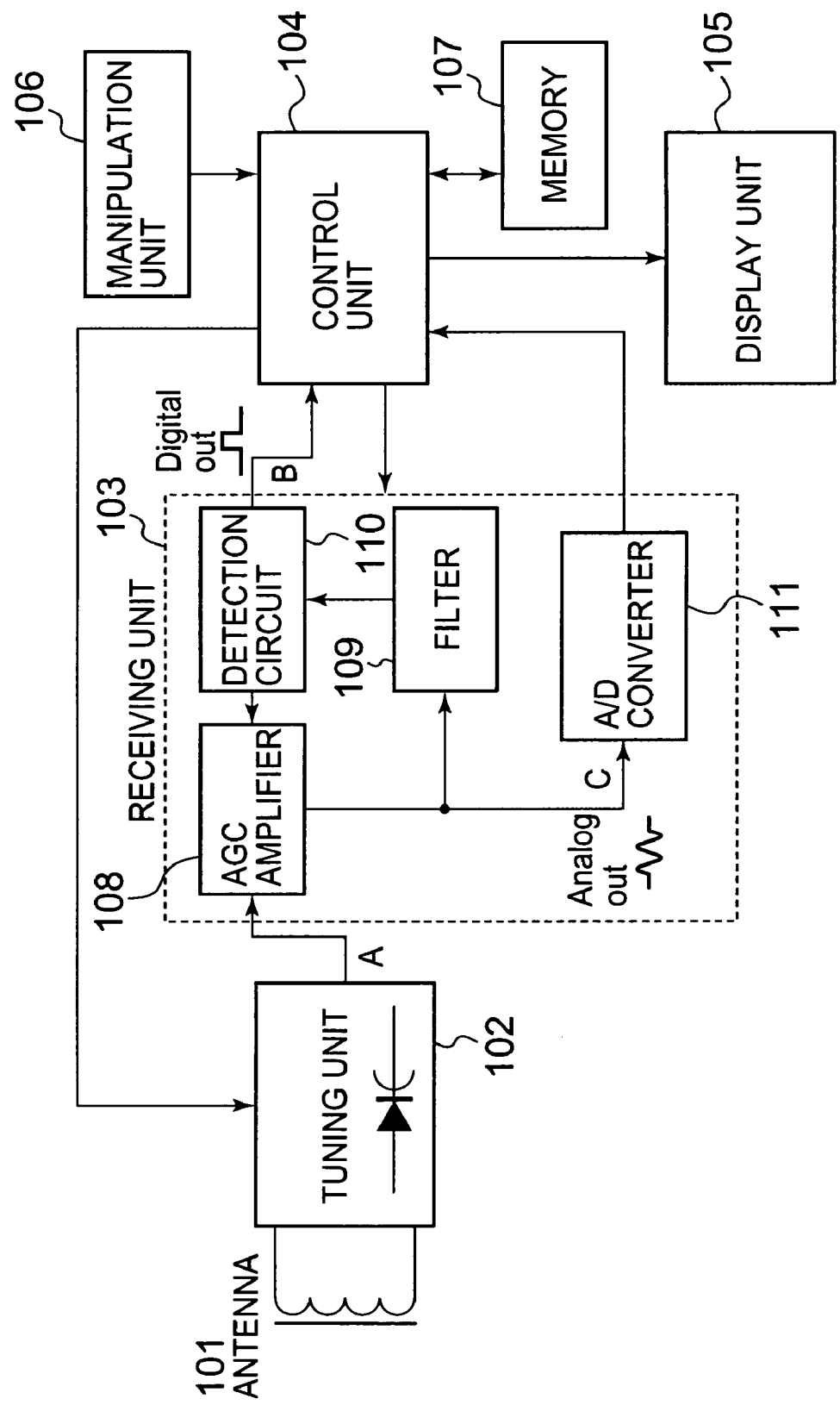
FIG. 1 is a block diagram of a radio-controlled timepiece according to an embodiment of the invention.
Figure 5:
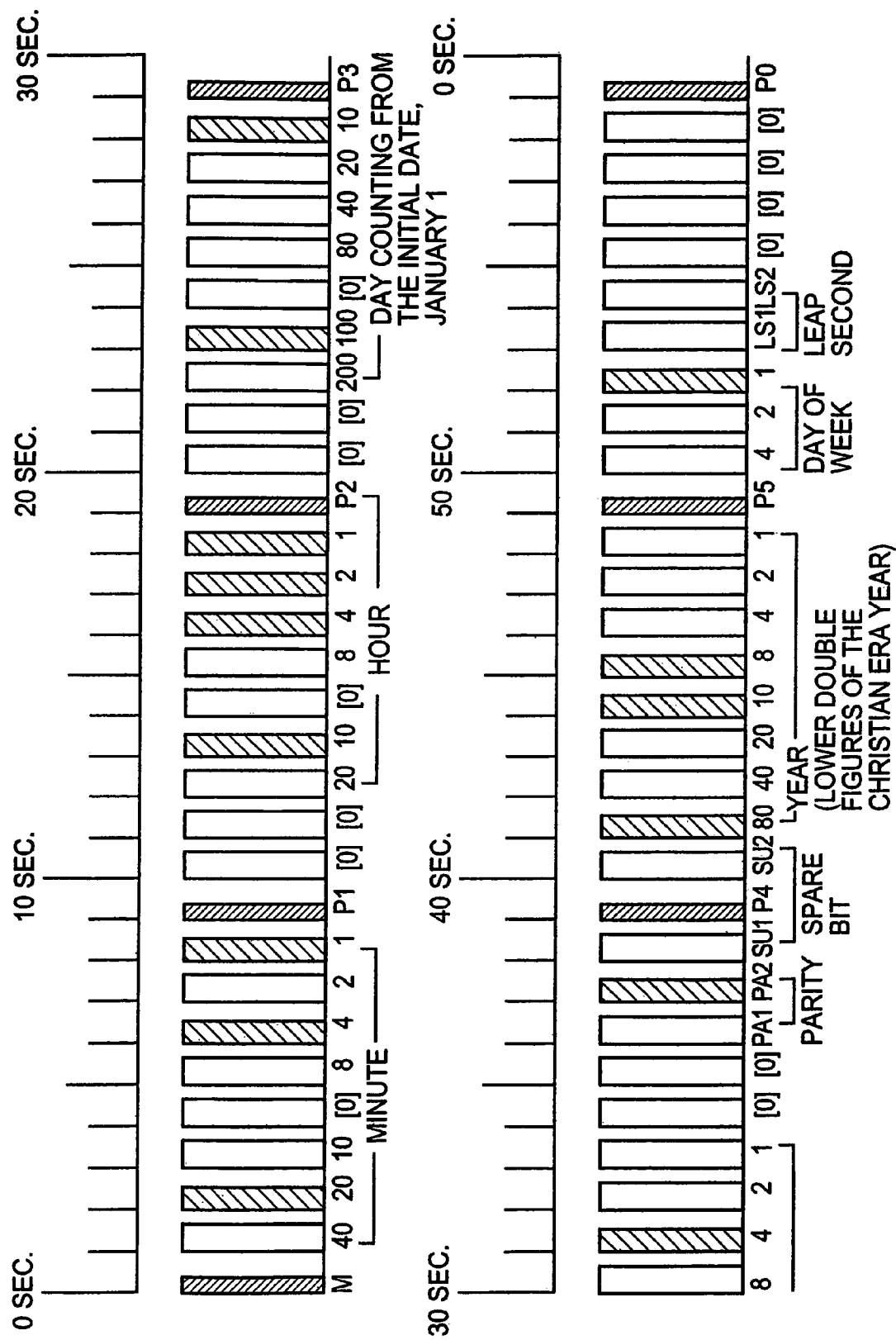
FIG. 5 is a view showing a time code of a standard radio wave used in Japan.

FIG. 1 is a block diagram of the radio-controlled timepiece according to the embodiment of the invention, which is an example of a radio-controlled timepiece that uses standard radio signals of Japan shown in FIG. 5 to correct time.

In FIG. 1, the radio-controlled timepiece has: an antenna 101 constituted by an antenna coil; a tuning unit having a variable-capacitance diode (varicap) 102 to change a tuning frequency; a receiving unit 103; a control unit 104 including a central processing unit (CPU) that performs control of constituent elements and the whole of the radio-controlled timepiece, etc.; a display unit 105 constituted by a liquid crystal display device or the like that displays the current time, etc.; a manipulation unit 106 including a manipulation switch or the like to e.g. provide instructions for a time-correcting process and a tuning operation; and a semiconductor memory 107 as a storing unit in which a program executed by the control unit 104, a capacitance value of the variable-capacitance diode 102, etc. are stored. Incidentally, the control unit 104 also performs the functions of a time-correcting unit and a clock unit.

The receiving unit 103 has: an AGC amplifier 108 as an AGC amplifier unit that amplifies a signal from the variable-capacitance diode 102; a filter 109 as a filter unit that lets a signal having a given frequency of output signals from the AGC amplifier 108 pass therethrough; a detection circuit 110 as a detection unit that detects an output signal of the filter 109 thereby to extract a time code included in a standard radio signal received with the antenna 101 and outputs the time code to the control unit 104; and an A/D converter 111.

The filter 109 has two or more quartz oscillators inside it; the quartz oscillators are switched and selected under the control of the control unit 104 thereby to select any one of signals of two or more frequencies and let the selected signal pass therethrough. Also, the detection circuit 110 extracts a time code from a signal that has passed-through the filter 109 and output the time code to the control unit 104 and controls the gain of the AGC amplifier 108. The A/D converter 111 converts an analog voltage signal output from the AGC amplifier 108 into a corresponding digital signal and outputs the resulting signal to the control unit 104.

Figure 2:
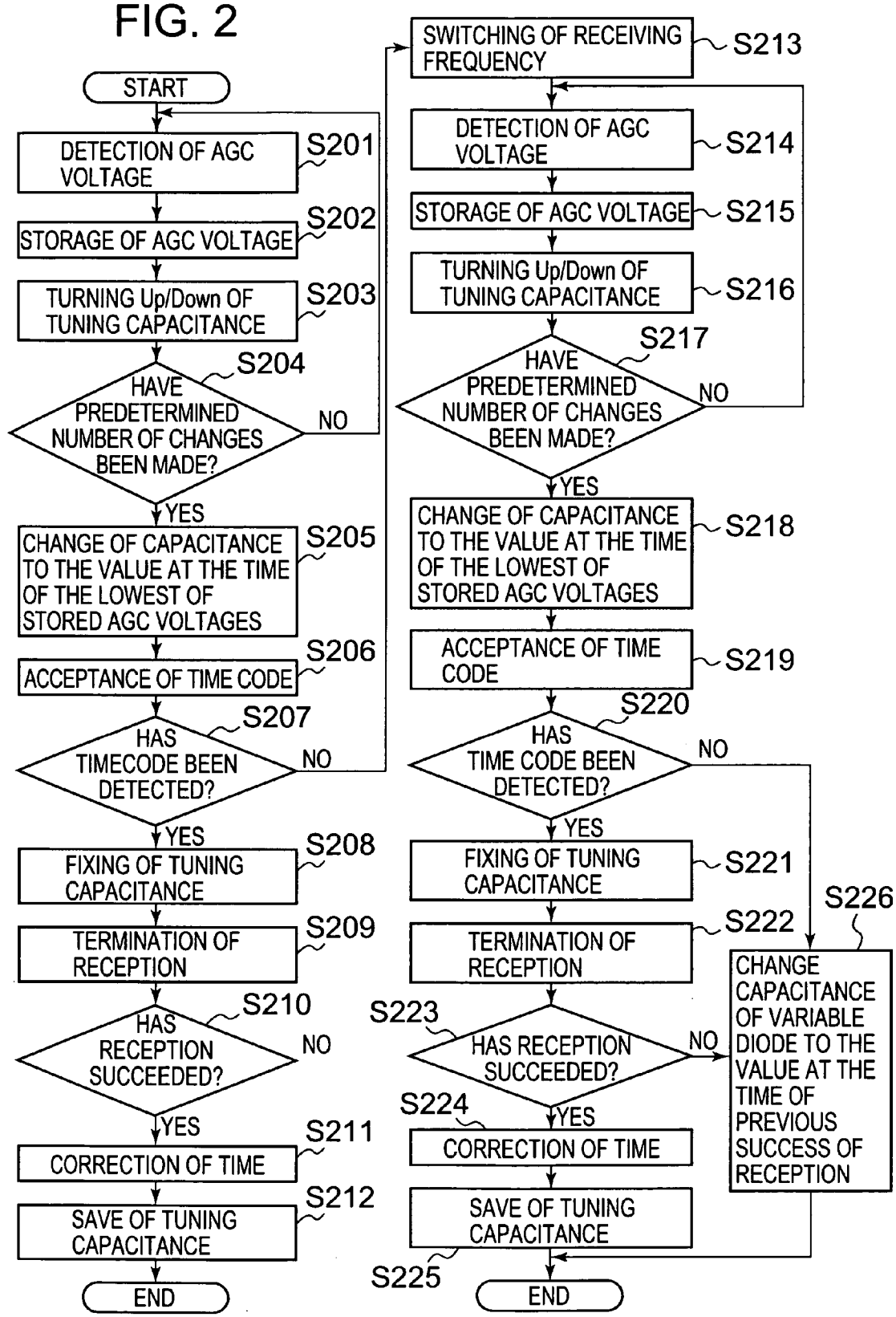
FIG. 2 is a flow chart showing the process in the radio-controlled timepiece according to the embodiment of the invention.

FIG. 2 is a flow chart showing the process by the radio-controlled timepiece in FIG. 1, which mainly shows the process performed when the control unit 104 executes a program previously stored in the memory 107.

Figure 3:
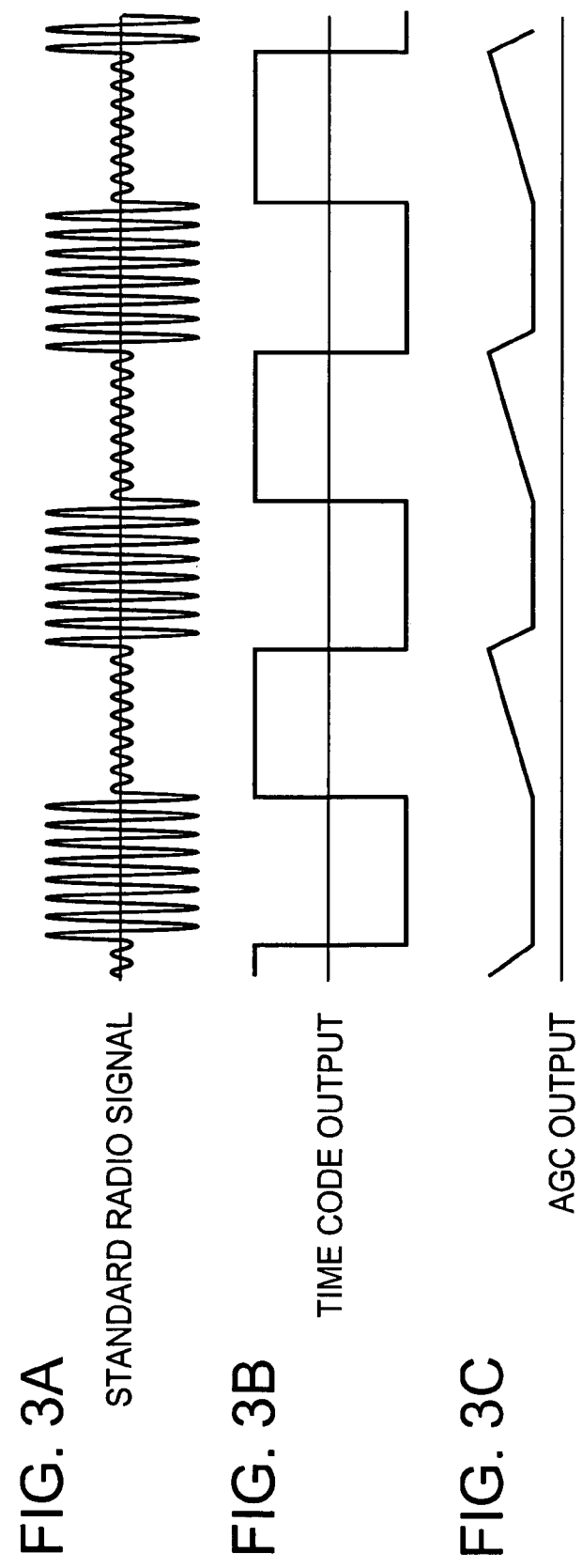
FIG. 3 is a timing chart of assistance in explaining the process in the radio-controlled timepiece according to the embodiment of the invention.
Figure 4:
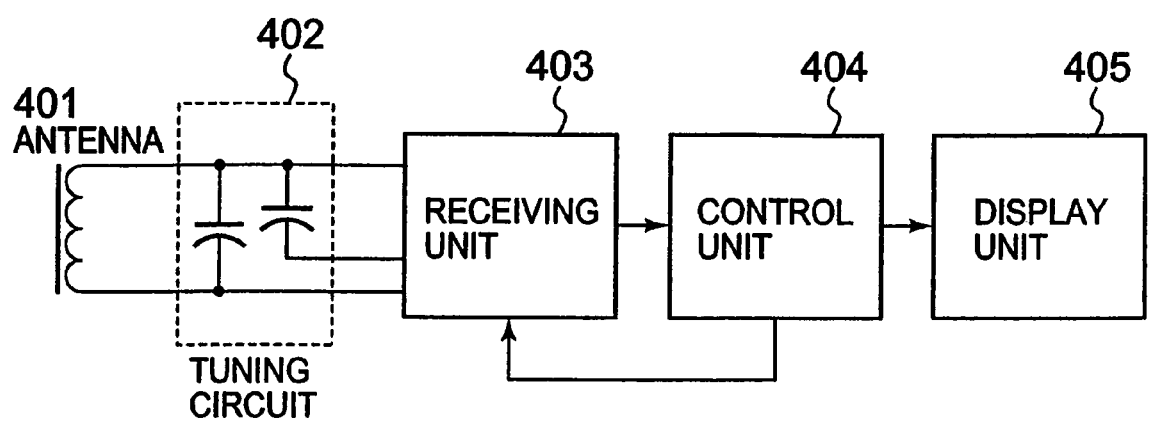
FIG. 4 is a block diagram of a conventional radio-controlled timepiece.

FIG. 3 is a timing chart of assistance in explaining the operation of the radio-controlled timepiece in FIG. 1.

The operation of the radio-controlled timepiece according to the embodiment will be described in detail below in reference to FIGS. 1-3.

In the radio-controlled timepiece, when a time previously stored in the memory 107 comes or when a user manipulates the manipulation unit 106 to thereby provide an instruction for the time-correcting process, the control unit 104 detects the start the time-correcting process.

When a time code was received at a tuning point to perform the time-correcting process in the preceding time-correcting process normally, the control unit 104 is operated so as to store capacitance value of the variable-capacitance diode at that time in the memory 107 as will be described later. Therefore, when the time-correcting process is started, the control unit 104 first exercise control so as to make the capacitance value stored in the memory 107 an initial value of the variable-capacitance diode 102 in the present time-correcting process.

In this condition, the control unit 104 outputs a control signal to the receiving unit 103 to exercise-control so that the receiving unit 103 starts a receiving operation. Thus, the receiving unit 103 starts the receiving operation.

A radio signal including a time code having current time information is received by the antenna 101 and inputs to the receiving unit 103 through the variable-capacitance diode 102 (tuning unit). In the receiving-unit 103, the AGC amplifier 108 amplifies a signal from the variable-capacitance diode 102, and the filter 109 lets a signal having a given frequency of signals input from the AGC amplifier 108 pass therethrough and inputs the signal to the detection circuit 110. The detection circuit 110 detects a signal from the filter 109 to extract a time code, outputs the extracted time code to the control unit 104, and controls the gain of the AGC amplifier 108.

Also, the A/D converter 111 converts the voltage level (AGC voltage) of a signal output from the AGC amplifier 108 in an analog format into a digital signal, and inputs the resulting signal to the control unit 104.

The control unit 104 detects the voltage level of a signal input from the A/D converter 111 (Step S201) and stores the voltage level of the signal in a memory 107 additionally in turn (Step S202).

Next, the control unit 104 changes the capacitance value of the variable-capacitance diode 102 by a given amount by increasing or decreasing the capacitance value by the given amount (Step S203), and then judges whether or not the above process has been performed a predetermined number of times (Step S204). When the process has not been performed the predetermined number of times, the control unit returns to Step S201 to repeat the process. By performing the process, two or more AGC voltage values will be stored in the memory 107.

In the case where it is judged at Step S204 that the process has been performed the predetermined number of times, the control unit 104 uses the capacitance value when the lowest of AGC voltages stored in the memory 107 was acquired as a tuning point to change the capacitance value of the variable-capacitance diode 102 to the capacitance value at the tuning point (Step S205).

In other words, the control unit 104 detects the voltage level of a signal output from the AGC amplifier 108 at two or more points while changing the capacitance value of the variable-capacitance diode 102 by a given value, and uses, as a tuning point, a point meeting a given requirement, of the points where the voltage level was detected (in the example, the requirement is that the AGC voltage is the lowest voltage).

The control unit 104 may be arranged so that, of the points where the voltage level is detected, a point where the voltage level falls within a given range decided previously is made, a tuning point. In this case, the given range of the voltage level is previously stored in the memory 107, and the control unit 104 refers to the memory 107 to determine the peak thereof.

FIG. 3 shows the relations among: a received signal A corresponding to a standard radio signal output from the variable-capacitance diode 102 (FIG. 3A); a time code B output from the detection circuit 110 (FIG. 3B); and an AGC voltage C output from the AGC amplifier 108 (FIG. 3C).

As shown in FIG. 3, in the case where the variable capacitance diode 102 is tuned to the standard radio signal, the variable-capacitance diode 102 outputs a received signal A of a given level, during which the AGC voltage stays at the lowest level and the detection circuit 110 outputs a time code. In the case where the variable-capacitance diode 102 is not tuned, the level of a signal output by the variable-capacitance diode 102 is smaller, and an AGC voltage output from the AGC amplifier 108 during this time is at a high level and thus no time code is output from the detection circuit 110. Like this, in this embodiment, when the AGC voltage output from the AGC amplifier 108 is at the lowest level, the variable-capacitance diode 102 stays at a tuning point.

In this condition, the control unit 104 accepts a signal (a time code if it is a normal signal) from the detection circuit 110 (Step S206), judges whether or not the signal from the detection circuit 110 is a digital signal (i.e. whether or not the signal is a signal of logical "1" or "0") thereby to judge whether or not the signal from the detection circuit 110 is a time code (Step S207).

When it is judged that a signal from the detection circuit 110 is a digital signal, namely when it is judged that the signal is a time code, the control unit 104 fixes the capacitance value of the variable-capacitance diode 102 at this time as a capacitance (tuning capacitance) for tuning to the radio signal (Step S208).

In this way, when it is judged that a time code has been output from the receiving unit 103 at the tuning point, the control unit sets the capacitance value of the variable-capacitance diode 102 at the tuning point as a capacitance value to receive the time code.

Next, the control unit 104 controls the receiving unit 103 so that the receiving unit 103 terminates its receiving operation after it receives signals for a predetermined time (Step S209).

Next, the control unit 104 judges whether or not the complete reception of time code has succeeded by the receiving operation until Step S209, namely whether or not the reception of all the information included in the time code and required to judge the current time has succeeded (Step S210).

When it is judged at Step S210 that the complete reception of time code has succeeded, the control unit 104 corrects the time, which the clock unit incorporated in the control unit 104 to clock time (its own clock unit) clocks, with the current time information included in the received time code (Step S211), then stores the capacitance value of the variable-capacitance diode 102 at this time in the memory 107, and terminates the time-correcting process (Step S212). Incidentally, the AGC voltage values stored in turn at Step S202 are erased.

The control unit controls the display unit 105 so that the corrected time of the clock unit is displayed by the display unit 105. Thus, the display unit 105 displays the corrected and precise current time.

In the case where it is judged at Step S207 that no time code can be detected, and the case where it is judged at Step S210 that the complete reception of time code has not succeeded, the control unit 104 judges that the tuning frequency deviates largely, and controls the filter 109 so as to use, of the quartz oscillators that the filter 109 has, one quartz oscillator instead of the currently used one. This can switch the frequency (receiving frequency) of a signal that can pass through the filter 109 (Step S213). Thus, the receiving frequency is changed, for example, from 40 kHz to 60 kHz.

In this condition, the control unit 104 outputs a control signal to the receiving unit 103 to control the receiving unit 103 so that it starts the receiving operation. Thus, the receiving unit 103 starts the receiving operation.

The control unit 104 detects the voltage level of a signal input from the A/D converter 111 (Step S214), and additionally stores the voltage level of the signal at this time in the memory 107 in turn (Step S215).

Next, the control unit 104 increases or decreases the capacitance value of the variable-capacitance diode 102 by a given amount, thereby to change the capacitance value by the given amount (S216), and judges whether or not this process has been done a predetermined number of times (Step S217). When the process has not been done the predetermined number of times, the control unit 104 returns to Step S201 and repeats the process. By performing the process, AGC voltage values are stored in the memory 107.

In the case where it is judged at Step S217 that the process has been performed the predetermined number of times, the control unit 104 uses the capacitance value when the lowest of AGC voltages stored in the memory 107 was acquired as a tuning point to change the capacitance variable-capacitance diode 102 to the capacitance value at the tuning point (Step S218).

In other words, the control unit 104 detects the voltage level of a signal output from the AGC amplifier 108 at two or more points while changing the capacitance value of the variable-capacitance diode 102 by a given value, and uses, as a tuning point, a point meeting a given requirement, of the points where the voltage level was detected.

In this condition, the control unit 104 accepts a signal (a time code if it is a normal signal) from the detection circuit 110 (Step S219), and judges whether or not the signal from the detection circuit 110 is a digital signal (whether or not the signal is logical "1" or "0") thereby to judge whether or not the signal from the detection circuit 110 is a time code (Step S220).

When it is judged that the signal from the detection circuit 110 is a digital signal, namely it is a time-code, the control unit 104 fixes the capacitance value of the variable-capacitance diode 102 at this time as a capacitance (tuning capacitance) for tuning to the radio signal (Step S221).

In this way, when it is judged that a time code has been output from the receiving unit 103. at the tuning point, the control unit sets the capacitance value of the variable-capacitance diode 102 at the tuning point as a capacitance value to receive the time code.

Then, the control unit 104 controls the receiving unit 103 so that the receiving unit 103 terminates the receiving operation after it receives signals for a predetermined time (Step S222).

Next, the control unit 104 judges whether or not the complete reception of time code has succeeded in the receiving operation by Steps S213-S222, namely whether or not the reception of all the information included in the time code and required for judgment of current time has succeeded (Step S223).

When it is judged at Step S223 that the complete reception of time code has succeeded, the control unit 104 corrects the time, which the clock unit incorporated in the control unit 104 to clock time (its own clock unit) clocks, with the current time information included in the received time code (Step S224), then stores the capacitance value of the variable-capacitance diode 102 at this time in the memory 107, and terminates the time-correcting process (Step S225). Incidentally, the AGC voltage values stored in turn at Step S215 are erased.

The control unit controls the display unit 105 so that the corrected time of the clock unit is displayed by the display unit 105. Thus, the display unit 105 displays the corrected and precise current time.

In the case where it is judged at Step S220 that no time code can be detected, and the case where it is judged at Step S223 that the complete reception of time code has not succeeded, the control unit 104 changes the capacitance value of the variable-capacitance diode 102 to a capacitance value last time when the reception succeeded, which is stored in the memory 107, and then terminates the process (Step S226).

In other words, in the case where it is judged that no time code can be received even when the frequency of signals that can pass through the filter 109 is changed, the control unit 104 changes the capacitance value of the variable-capacitance diode 102 to a capacitance value when the reception of time code succeeded and terminates the time-correcting process.

As described above, the embodiment of the invention enables tuning to a standard radio signal readily, and also tuning to two or more standard radio signals different in frequency.

In addition, it eliminates the need for fine adjustment of the tuning frequency in assembling and as such, the assembling work can be performed simply for a reduced time and its handling can be facilitated.

Further, even when the tuning frequency is changed owing to the temperature, etc., it is possible to automatically adjust the tuning frequency to a tuning condition. Therefore, an effect such that the receiving sensitivity is increased is produced consequently.

Now, the control unit 104 may be arranged so that when a user provides an instruction for the tuning operation with the manipulation unit 106, the control unit 104 performs the tuning operation except the process steps S211, S224 in response to the instruction for the tuning operation by the manipulation unit 106. In this case, the control unit 104 does not perform the time-correcting operation, but it changes the capacitance value of the variable-capacitance diode 102 so as to tune in to the radio signal. Also, the control unit 104 stores the changed capacitance value of the variable-capacitance diode 102 in the memory 107. In the next time-correcting process, the capacitance value stored in the memory 107 will be used as an initial value.

The memory 107 is arranged so that the capacitance value of the variable-capacitance diode 102 is stored therein. However, it may be arranged so that information to specify a frequency that the filter 109 allowed to pass therethrough when the reception succeeded (e.g. information to specify the quartz oscillator that the filter used) is stored in the memory 107 together with the capacitance value of the variable-capacitance diode 102. In this case, the control unit 104 may be arranged so that it uses, as initial values, the capacitance value of the variable-capacitance diode 102 and the frequency that can pass through the filter 109 stored in the memory 107 in the subsequent time-correcting process to start the tuning process.

Further, in the embodiment, the variable-capacitance diode 102 is used to change the tuning frequency. However, it is possible to use a variable-capacitance unit as long as it is a constituent element that can change the capacitance value, such as a variable capacitor.

Also, in the embodiment, an AGC-amplifying amplifier is used to amplify a signal received by the antenna 101. However, an amplifier unit that merely amplifies a signal may be used. In this case, the tuning unit may be arranged so that the capacitance value of the variable-capacitance unit therein is changed and controlled based on the output signal of the amplifier unit.

Figure 6:
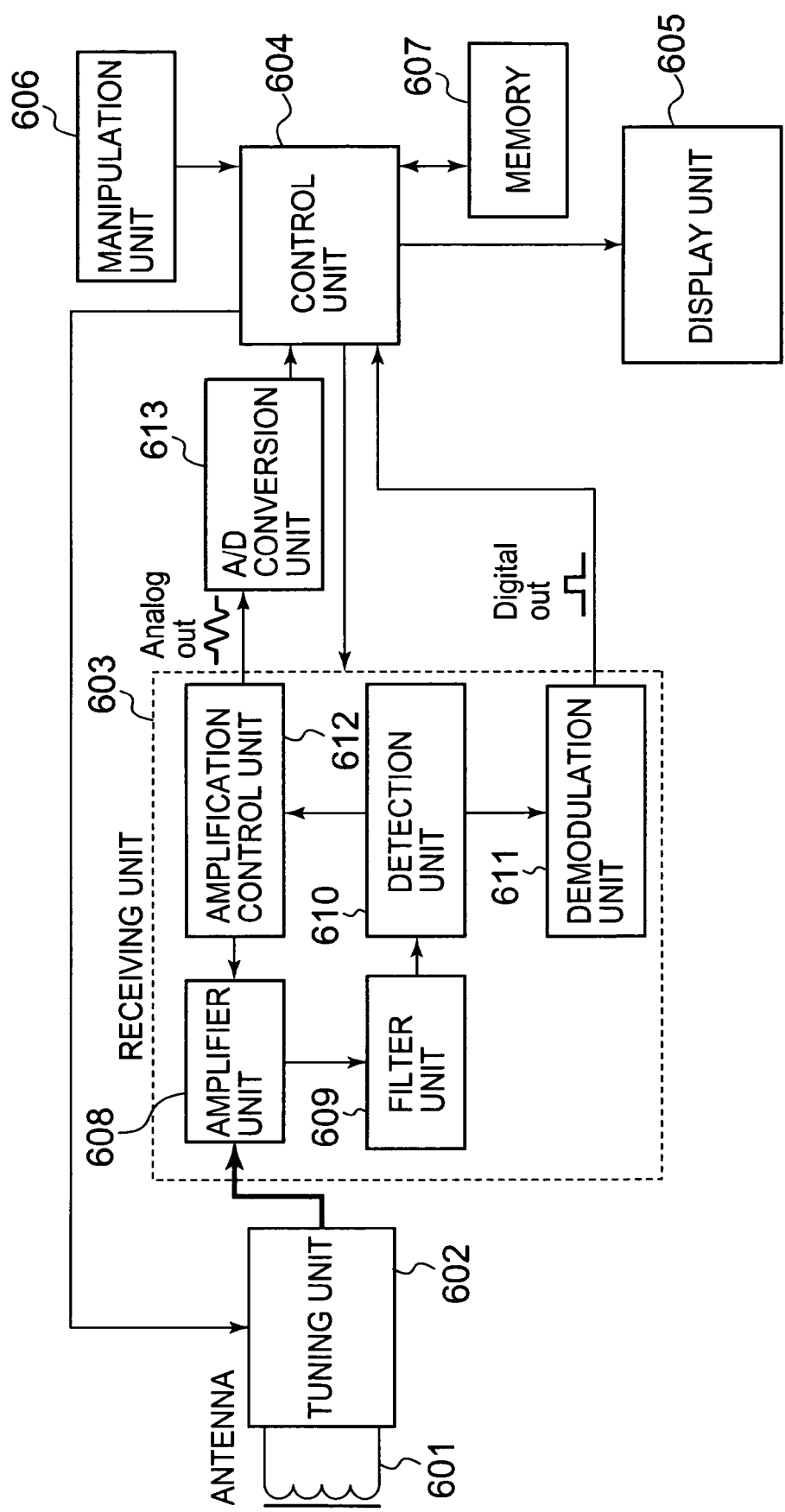
FIG. 6 is a block diagram of a radio-controlled timepiece according to an additional embodiment of the invention.

FIG. 6 is a block diagram of a radio-controlled-timepiece according to an additional embodiment of the invention, which is an example of a radio-controlled timepiece that corrects time using standard radio signals of Japan shown in FIG. 5 as in the foregoing embodiment.

In FIG. 6, the radio-controlled timepiece has: an antenna 601 constituted by an antenna coil; a tuning unit 602 to change a tuning frequency; a receiving unit 603; a control unit 604 including a central processing unit (CPU) that performs control of constituent elements and the whole of the radio-controlled timepiece, etc.; a display unit 605 constituted by a liquid crystal display device or the like that displays the current time, etc.; a manipulation unit 606 including a manipulation switch or the like to e.g. provide instructions for a time-correcting process and a tuning operation; a semiconductor memory 607 as a storing unit in which a program executed by the control unit 604, a capacitance value of a variable-capacitance unit (not shown) included in the tuning unit, etc. are stored; and an analog/digital (A/D) conversion unit 613 that converts an analog signal output from an amplification control unit in the receiving unit 603 into a digital signal, and outputs the resulting signal to the control unit 604. Incidentally, the control unit 604 has the functions as a time-correcting unit and a clock unit, too.

The receiving unit 612 has: an amplifier unit 608 that amplifies a signal from the tuning unit 602; a filter unit 609 that lets a signal having a given frequency of output signals from the amplifier unit 608 pass therethrough; a detection unit 610 that detects and outputs an output signal of the filter unit 609; a demodulation unit 611 that demodulates an output signal of the detection unit 610 thereby to extract a time code included in a standard radio signal received by the antenna 601 and outputs the time code to the control unit 604; and an amplification control unit 612 that controls the gain of the amplifier unit 608 according to an output signal of the detection unit 610. The amplifier unit 608 is an amplification circuit whose gain is variable, which is controlled by the amplification control unit 612 so as to have a gain according to the voltage level (AGC voltage) of a control signal from the amplification control unit 603.

Now, the correspondence between the embodiment in FIGS. 1 and 6 will be described. An AGC amplifier unit constituted by the amplifier unit 608 and the amplification control unit 612 has a function representing the AGC amplifier 108. A combination of the detection unit 610 and the demodulation unit 611 has a function representing the detection circuit 110. The A/D conversion unit 613 has a function representing the A/D converter 111. The manipulation unit 606 has a function representing the manipulation unit 106. The memory 607 has a function representing the memory 107.

Figure 7:
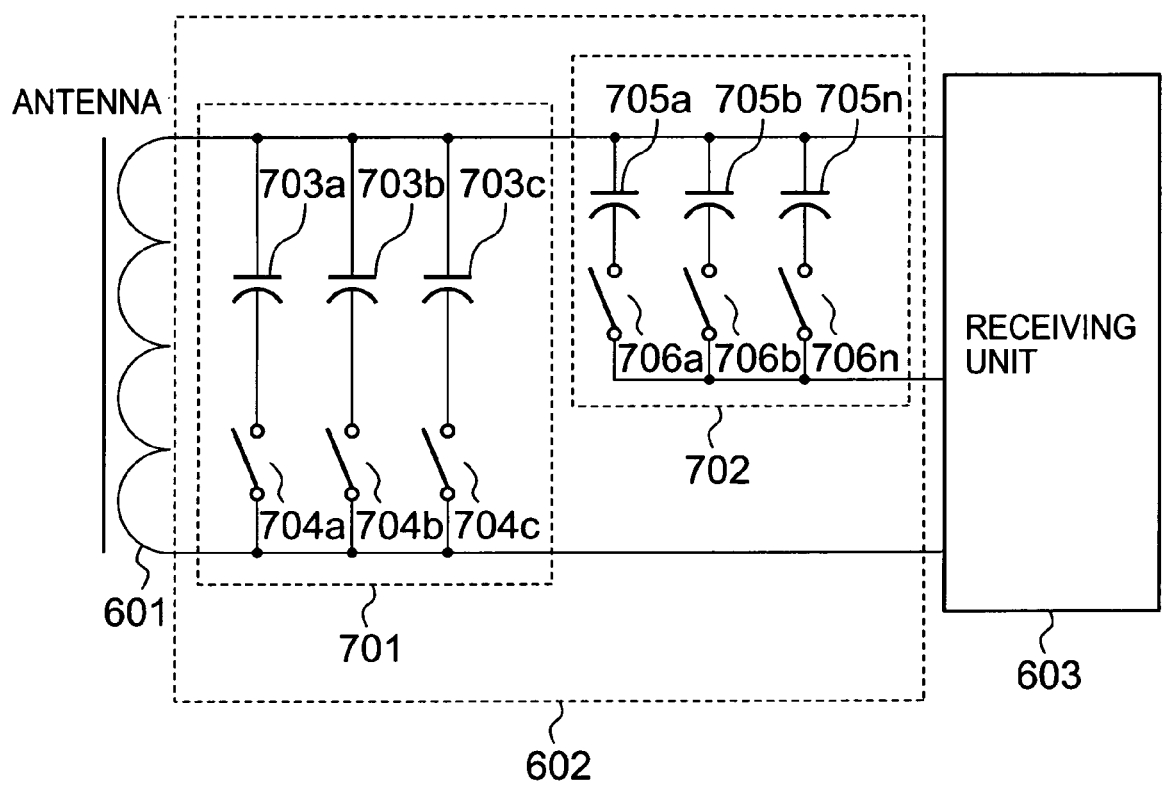
FIG. 7 is a circuit diagram showing the configuration of a tuning unit used for the additional embodiment of the invention.

FIG. 7 is a circuit diagram showing a configuration of the tuning unit 602, in which like parts are labeled with the same reference character in FIG. 6.

In FIG. 7, the tuning unit 602 includes: a rough adjustment part 701 having two or more capacitors 703a-703c different in capacitance value from each other; and a fine adjustment part 702 having finely-adjusting capacitors 705a-705n to finely adjust the capacitance values of the capacitors 703a-703c, which are smaller in capacitance value than the capacitors 703a-703c of the rough adjustment part 701. The capacitors 703a-703c are selected so that it can provided capacitance values (i.e. capacitance values substantially tunable to) corresponding to the frequencies of received signals (e.g. 40 kHz and 60 kHz for Japan, America, England, and 77.5 kHz for Germany). The capacitance values of the capacitors 705a-705n are set to smaller values in comparison to the capacitors 703a-703c.

To the capacitors 703a-703c, 705a-705n are respectively connected on-off switches 704a-704c, 706a-706n in series. The rough adjustment part 701 and the fine adjustment part 702 constitute a variable-capacitance unit. The control unit 604 combines the capacitors 703a-703c, 705a-705n included in the rough adjustment part 701 and the fine adjustment part 702 based on a signal from the A/D conversion unit 613 thereby to change the capacitance value of the variable-capacitance unit.

The tuning unit may be arranged so that two or more finely-adjusting capacitors 705a-705n are included in the fine adjustment part 702 as shown in FIG. 7, and the control unit 604 selects a combination of the capacitors 703a-703c, 705a-705n included in the rough adjustment part 701 and the fine adjustment part 702 thereby to change the capacitance value of the variable-capacitance unit. However, the tuning unit may be arranged so that the finely-adjusting capacitors 705a-705n included in the fine adjustment part 702 are each constituted by one or more variable-capacitance diodes, and the control unit 604 selects the capacitor 703a-703c of the rough adjustment part 701 and concurrently exercises control so as to change the capacitance value of the one or more variable capacitance diodes, thereby to change the capacitance value of the variable-capacitance unit. In this case the finely-adjusting capacitors included in the fine adjustment part 702 may be each constituted by one or more variable-capacitance diodes, and the control unit 604 may select the capacitor of the rough adjustment part 701 and concurrently control the capacitance value of the one variable-capacitance diode or controls the capacitance values of the variable-capacitance diodes to synthesize, thereby to change the capacitance value of the variable-capacitance unit.

Figure 8:
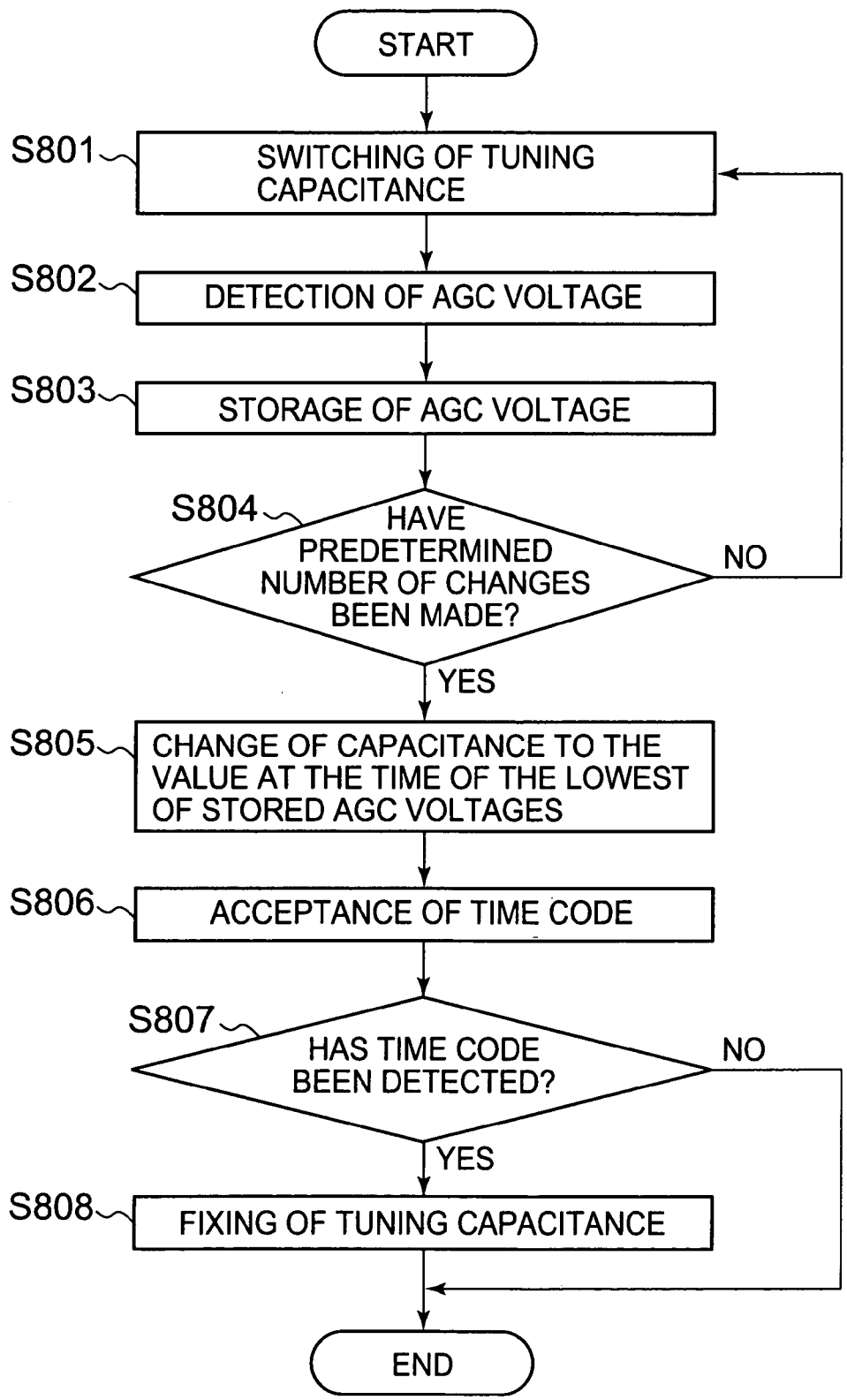
FIG. 8 is a flow chart showing the process in the radio-controlled timepiece according to the additional embodiment of the invention.

FIG. 8 is a flow chart showing the processes in the radio-controlled timepiece shown in FIGS. 6 and 7, in which the processes are performed principally when the control unit 604 executes a program previously stored in the memory 607.

Details of the operation of a radio-controlled timepiece according to the additional embodiment of the invention will be described below in reference to FIGS. 6-8. Since the operation timing of the radio-controlled timepiece is the same as that in the above-described embodiment, the description will be presented in reference to FIG. 3 as required.

In the radio-controlled timepiece, when a time previously stored in the memory 607 comes or when a user manipulates the manipulation unit 606 thereby to provide an instruction for the time-correcting process, the control unit 604 detects that and starts the time-correcting process.

When a time code was received at a tuning point to perform the time-correcting process in the preceding time-correcting process normally, the control unit 604 operated so as to store the capacitance value of the variable-capacitance unit in the tuning unit 602 at that time in the memory 607, as described later. Therefore when the time-correcting process is started, the control unit 604 first exercises control so as to make the capacitance value stored in the memory 607 an initial value of the variable-capacitance unit in the present time-correcting process. Thus, the switches 704a-704c of the rough adjustment part 701 and the switches 706a-706n of the fine adjustment part 702 are controlled in their opening and closing conditions selectively so that the total capacitance value of the rough adjustment part 701 and the fine adjustment part is equal to the capacitance value, and selection is made from among the capacitors 703a-703c of the rough adjustment part 701 and the capacitors 705a-705n of the fine adjustment part 702 (Step S801).

In this condition, the control unit 604 outputs a control signal to the receiving unit 603 and controls the receiving unit 603 so that it starts the receiving operation. Thus, the receiving unit 603 starts the receiving operation.

A radio signal including a time code having current time information is received by the antenna 601, and input to the receiving unit 603 through the tuning unit 602. In the receiving unit 603, the amplifier unit 608 merely amplifies a signal from the tuning unit 602, and the filter unit 609 lets a signal having a given frequency of signals input from the amplifier unit 608 pass therethrough and inputs the signal to the detection unit 610.

The detection unit 610 detects a signal from the filter unit 609 and outputs the resulting signal to the demodulation unit 611. The demodulation unit 611 demodulates a signal from the detection unit 610. Thus, the demodulation unit 611 extracts a time code in a signal output from the amplifier unit 608 and outputs the extracted time code to the control unit 604 in a digital signal.

Also, the detection unit 610 detects a signal from the filter unit 609 and outputs the resulting signal to the amplification control unit 612. The amplification control unit 612 supplies the amplifier unit with a control signal having a voltage level according to a signal from the detection unit 610. Thus, the amplification control unit 612 controls the amplifier unit 608 according to the level of a signal from the amplifier unit 608 so that the gain of the amplifier unit 608 is appropriate.

In addition, the A/D conversion unit 613 converts the voltage level (AGC voltage) of the control signal output in an analog signal form from the amplification control unit into a digital signal to input the resulting signal to the control unit 604.

The control unit 604 detects the voltage level of the control signal input from the A/D conversion unit 613 (Step S802) and stores the voltage level at this time in the memory 607 additionally (Step S803). The control unit 604 judges whether or not the process has been performed a predetermined number of times (Step S804). When the process has not been performed the predetermined number of times, the control unit 604 returns to Step S801.

The predetermined number of times is one that the process is performed on a predetermined combination of the capacitor included in the rough adjustment part 701 and the capacitor included in the fine adjustment part 702.

For example, in FIG. 7, one of the roughly-adjusting capacitors 703a-703c is selected first, whereby rough adjustment is performed. In this condition, finely-adjusting capacitors 705a-705n are selected one by one in turn, and the selected finely-adjusting capacitor is connected in parallel with the selected roughly-adjusting capacitor, whereby the capacitance value is adjusted finely. The operation is performed for all the roughly-adjusting capacitors 703a-703c.

The operation will be performed for each of the roughly-adjusting capacitors 703a-703n times, and therefore the predetermined number of times will be 3n times. Incidentally, the tuning unit may be arranged so that at least two of the finely-adjusting capacitors 705a-705n are selected for each of the roughly-adjusting capacitors 703a-703c.

When it is judged at Step S804 that the process has not been performed the predetermined number of times, the control unit 604 changes the combination of the capacitors 763a-703c that the rough adjustment part 701 in the tuning unit 602 includes and the capacitors 705a-705n that the fine adjustment part 702 includes, whereby the capacitance value of the variable-capacitance unit is increased or decreased by a given amount to change the capacitance value by the given amount (Step S801). Thereafter, the control unit 604 executes the process steps S802 and S803. By performing the process, two or more AGC voltage values are stored in the memory 607.

When it is judged at Step S804 that the process has been performed the predetermined number of times, the control unit 604 uses the capacitance value when the lowest of AGC voltages stored in the memory 607 was acquired as a tuning point to change the capacitance value of the variable-capacitance unit (the total of capacitance values of the selected capacitors of capacitors included in the rough adjustment part 701 and fine adjustment part) to the capacitance value at the tuning point (Step S805). In other words, the control unit 604 detects the voltage level of a signal output from the amplifier unit 608 at two or more points while changing the capacitance value of the variable-capacitance unit by a given value, and uses, as a tuning point, a point meeting a given requirement (the AGC voltage is the lowest voltage in the example), of the points where the voltage level was detected.

The control unit 604 may be arranged so that, of the points where the voltage level is detected, a point where the voltage level falls within a given range decided previously is made a tuning point. In this case, the given range of the voltage level is previously stored in the memory 607, and the control unit 604 refers to the memory 607 to determine the peak thereof.

As shown in FIG. 3, in the case where the tuning unit 602 is tuned to the standard radio signal, the tuning unit 602 outputs received signal A of a given level, during which the AGC voltage stays at the lowest level and the detection unit 610 outputs a time code. In the case where the tuning unit 602 is not tuned, the level of a signal output by the tuning unit 602 is smaller, and an AGC voltage output from the amplification control unit 612 during this time is at a high level and thus no time code is output from the demodulation unit 611. Like this, in this embodiment, when the AGC voltage output from the amplification control unit 612 is at the lowest level, the variable-capacitance unit stays at a tuning point.

In this condition, the control unit 604 accepts a signal (a time code if it is a normal signal) from the demodulation unit 611 through the detection unit 610 (Step S806), judges whether or not the signal from the demodulation unit 611 is a digital signal (i.e. whether or not the signal is a signal of logical "1" or "0") thereby to judge whether or not the signal from the demodulation unit 611 is a time code (Step S807).

When it is judged that a signal from the demodulation unit 611 is a digital signal, namely when it is judged that the signal is a time code, the control unit 604 fixes the capacitance value of the variable-capacitance unit at this time (i.e. the total capacitance value of the selected capacitors of the capacitors 703a-703c, 705a-705n of the rough adjustment part 701 and fine adjustment part 702) as a capacitance (tuning capacitance) for tuning to the radio signal (Step S808).

In this way, when it is judged that a time code has been output from the receiving unit 603 at the tuning point, the control unit 604 sets the capacitance value of the variable-capacitance unit at the tuning point as a capacitance value to receive the time code.

After that, the process is executed as in the process steps S209-212 in FIG. 2 to perform an operation to correct time and an operation to save a tuning capacitance.

On the other hand, when it is judged at Step S807 that no time code can be detected, the control unit 604 terminates the process. In this case, the same process as that in the process step S226 in FIG. 2 may be performed.

As described above, the additional embodiment enables tuning to a standard radio signal readily, and also tuning to two or more standard radio signals different in frequency, as in the foregoing embodiment.

In addition, it eliminates the need for fine adjustment of the tuning frequency in assembling and as such, the assembling work can be performed simply for a reduced time and its handling can be facilitated.

Further, even when the tuning frequency is changed owing to the temperature, etc., it is possible to automatically adjust the tuning frequency to a tuning condition. Therefore, an effect such that the receiving sensitivity is increased is produced consequently.

Now, also in the embodiment as in the foregoing embodiment, the control unit 604 may be arranged so that when a user provides an instruction for the tuning operation with the manipulation unit 606, the control unit 604 performs the tuning operation in response to the instruction for the tuning operation by the manipulation unit 606. In this case, the control unit 604 does not perform the time-correcting operation, but it selects a combination of the capacitors 703a-703c, 705a-705n included in the rough adjustment part 701 and fine adjustment part 702 of the variable-capacitance unit so as to tune in to the radio signal and changes the capacitance value. In addition, the control unit 604 stores the changed capacitance value of the variable-capacitance unit in the memory 607. In the subsequent time-correcting process, the capacitance value stored in the memory 607 is used as an initial value.

Further, the embodiment is arranged so that information on the combination of the capacitors 703a-703c, 705a-705n to realize a capacitance value of the variable-capacitance unit is stored in the memory 607. However, it may be arranged so that the signal-pass capability of the filter unit 609 is made variable, and the information to identify a frequency that the filter unit 609 allowed to pass therethrough when the reception succeeded (e.g. the information to identify the quartz oscillator that the filter unit 609 used) is stored in the memory 607 together with the capacitance value of the variable-capacitance unit 602. In this case, the control unit 604 may be arranged so as to use, as initial values, a capacitance value of the variable-capacitance unit and a pass-through frequency of the filter unit 609 stored in the memory 607 to start the tuning process in the subsequent time-correcting process.

Also in the embodiment, one or more variable-capacitance diodes may be used as a finely-adjusting capacitor. In this case, the finely-adjusting capacitor is not only selected, but also arranged so that the control unit 604 can control the change in its capacitance value, whereby adjustment of the capacitance value can be performed.

Also, the embodiment is arranged so that the variable-capacitance unit in the tuning unit 602 is controlled based on an output signal of the amplification control unit 612. However, it may be arranged that the capacitance value of the variable-capacitance unit is changed and controlled based on the level of a signal output from the amplifier unit 608.

In addition, in the embodiments, various changes may be made on capacitors used for change in tuning frequency. For example, the capacitors may be arranged so as to not only utilize variable-capacitance capacitors, but also utilize a capacitor inside the integrated circuit (IC) in use and directly switch the capacitor inside the IC.

Further, in the embodiments, the timing for tuning can be appropriately selected from the timing with which the tuning is carried out each time of reception, at the time when the reception falls through, or periodically at previously decided given time, the timing with which the tuning is carried out at the time of shipment of products or reset of the radio-controlled timepiece in the replacement of the battery thereof or the like.

Still further, in the embodiments, the method to judge whether or not a signal is a time code may be arranged so that the judgment is made based on whether or not an edge (rising edge or falling edge) of a received digital signal has been able to be detected precisely and continuously a predetermined number of times.

The invention enables tuning in to a standard radio signal readily. Also, it becomes possible to tune in to two or more standard radio signals different in frequency.

It eliminates the need for fine adjustment of the tuning frequency in assembling and as such, the assembling work can be performed simply for a reduced time and its handling can be facilitated.

Further, even when the tuning frequency is changed owing to the temperature, etc., it is possible to automatically adjust the tuning frequency to a tuning condition. Therefore, an effect such that the receiving sensitivity is increased is produced consequently.

The invention can be applied to radio-controlled timepieces utilized in the countries where a standard radio wave for correction of time is used, such as America as well as Japan.

What is claimed is:

1. A radio-controlled timepiece comprising:
   an antenna that receives a radio signal including a time code having current time information;
   a tuning unit that outputs a signal corresponding to the radio signal received by the antenna, the tuning unit having a variable-capacitance unit;
   an amplifier unit that amplifies a signal output from the tuning unit;
   a receiving unit that extracts the time code from a signal amplified by the amplifier unit, the receiving unit having a filter unit that selectively allows one of plural frequency signals to pass therethrough, and a detection unit that extracts the time code from a signal having passed through the filter unit to output the time code;
   a time-correcting unit that acquires current time information from the time code extracted by the receiving unit to correct a current time clocked by a clock unit;
   a display unit that displays the current time clocked by the clock unit; and
   a control unit that detects a voltage level of a signal output from the amplifier unit at a plurality of points while changing a capacitance value of the variable-capacitance unit, that uses, as a tuning point, a point meeting a given requirement among the points where the voltage level has been detected, and that sets the capacitance value of the variable-capacitance unit at the tuning point as a capacitance value to receive the time code when it is judged that a time code has been output from the receiving unit at the tuning point;
   wherein when it is judged that no time code is output from the receiving unit at the tuning point, the control unit controls the filter unit so as to change the frequency that the filter unit allows a signal to pass therethrough.

2. A radio-controlled timepiece according to claim 1; wherein the variable-capacitance unit includes a variable-capacitance diode, and the amplifier unit is an AGC amplifier unit.

3. A radio-controlled timepiece according to claim 1; wherein the variable-capacitance unit includes a rough adjustment part having roughly-adjusting capacitors different in capacitance value from each other, and a fine adjustment part having finely-adjusting capacitors smaller in capacitance value than the roughly-adjusting capacitors; and wherein the control unit combines the roughly-adjusting capacitors and finely-adjusting capacitors to thereby change the capacitance value of the variable-capacitance unit.

4. A radio-controlled timepiece according to claim 3; wherein the roughly-adjusting capacitors are selected so as to provide a capacitance value corresponding to a receiving frequency; and wherein the control unit uses the finely-adjusting capacitor to finely adjust a deviation of a tuning frequency from the receiving frequency when the roughly-adjusting capacitor is used.

5. A radio-controlled timepiece according to claim 3; wherein the finely-adjusting capacitors of the fine adjustment part comprise variable-capacitance diodes; and wherein the control unit selects the roughly-adjusting capacitors of the rough adjustment part and changes a capacitance value of the variable-capacitance diodes to thereby change the capacitance value of the variable-capacitance unit.

6. A radio-controlled timepiece according to claim 3; wherein the amplifier unit is an AGC amplifier unit.

7. A radio-controlled timepiece according to claim 1; wherein the point meeting the given requirement is a point where the voltage level is the lowest.

8. A radio-controlled timepiece according to claim 7; wherein the receiving unit has an A/D converter that converts the voltage level of a signal output from the amplifier unit into a digital signal; and wherein the control unit determines the tuning point based on the digital signal output from the A/D converter.

9. A radio-controlled timepiece according to claim 1; wherein the point meeting the given requirement is a point where the voltage level falls within a preselected range.

10. A radio-controlled timepiece according to claim 9; wherein the receiving unit has an A/D converter that converts the voltage level of a signal output from the amplifier unit into a digital signal; and wherein the control unit determines the tuning point based on the digital signal output from the A/D converter.

11. A radio-controlled timepiece according to claim 1; further comprising a storing unit that stores a capacitance value of the variable-capacitance unit when reception of the time code has succeeded; and wherein when it is judged that no time code is received even when the frequency that the filter unit allows a signal to pass therethrough is changed, the control unit sets the capacitance value of the variable-capacitance unit to the capacitance value stored in the storing unit and corresponding to when reception of the time code has succeeded and terminates a time-correcting process.

12. A radio-controlled timepiece according to claim 11; wherein when the time code is received to perform the time-correcting process, the control unit stores the capacitance value of the variable-capacitance unit at that time in the storing unit, and exercises control so that the capacitance value stored in the storing unit is made an initial value of the variable-capacitance unit in a subsequent time-correcting process.

13. A radio-controlled timepiece according to claim 11; wherein the variable-capacitance unit comprises a variable-capacitance diode.

14. A radio-controlled timepiece according to claim 1; wherein the control unit judges that the time code has been received when an edge of a received digital signal has been detected successively a given number of times.

15. A radio-controlled timepiece according to claim 14; wherein the control unit further changes the capacitance value of the variable-capacitance unit so as to tune in to the radio signal at a previously decided time or a time of reset.

16. A radio-controlled timepiece according to claim 1; further comprising a manipulation unit that provides an instruction for a tuning operation; and wherein the control unit changes the capacitance value of the variable-capacitance unit so as to tune in to the radio signal in response to the instruction for the tuning operation provided by the manipulation unit.

17. A radio-controlled timepiece comprising:
an antenna that receives a radio signal including a time code having current time information;
a tuning unit having a variable-capacitance unit and that outputs a signal corresponding to the radio signal received by the antenna;
an amplifier unit that amplifies a signal output from the tuning unit;
a receiving unit that extracts the time code from a signal amplified by the amplifier unit, the receiving unit having a filter unit that selectively allows one of plural frequency signals to pass therethrough;
a storing unit that stores a capacitance value of the variable-capacitance unit when reception of the time code has succeeded;
a time-correcting unit that acquires current time information from the time code extracted by the receiving unit to correct a current time clocked by a clock unit;
a display unit that displays the current time clocked by the clock unit; and
a control unit that detects a voltage level of a signal output from the amplifier unit at a plurality of points while changing a capacitance value of the variable-capacitance unit, that uses, as a tuning point, a point meeting a given requirement among the points where the voltage level has been detected, and that sets the capacitance value of the variable-capacitance unit at the tuning point as a capacitance value to receive the time code when it is judged that a time code has been output from the receiving unit at the tuning point;
wherein when it is judged that no time code is output from the receiving unit at the tuning point, the control unit controls the filter unit so as to change the frequency that the filter unit allows a signal to pass therethrough; and
wherein when it is judged that no time code is received even when the frequency that the filter unit allows a signal to pass therethrough is changed, the control unit sets the capacitance value of the variable-capacitance unit to the capacitance value stored in the storing unit and corresponding to when reception of the time code has succeeded.

18. A radio-controlled timepiece according to claim 17; wherein the variable-capacitance unit comprises a variable-capacitance diode.

19. A radio-controlled timepiece according to claim 17; wherein the amplifier unit is an AGC amplifier unit.

20. A radio-controlled timepiece according to claim 17; wherein the point meeting the given requirement is one of a point where the voltage level is the lowest.

* * * * *